United States Patent
Lan et al.

(10) Patent No.: US 12,557,429 B2
(45) Date of Patent: Feb. 17, 2026

(54) PEROVSKITE SOLAR CELL

(71) Applicant: TAIWAN PEROVSKITE SOLAR CORP., Zhubei (TW)

(72) Inventors: Shiang Lan, Zhubei (TW); Chih-Hsuan Chao, Zhubei (TW)

(73) Assignee: TAIWAN PEROVSKITE SOLAR CORP., Zhubei (TW)

( * ) Notice: Subject to any disclaimer, the term of this patent is extended or adjusted under 35 U.S.C. 154(b) by 150 days.

(21) Appl. No.: 18/541,120

(22) Filed: Dec. 15, 2023

(65) Prior Publication Data

US 2025/0160040 A1 May 15, 2025

(30) Foreign Application Priority Data

Nov. 15, 2023 (TW) ................. 112144043

(51) Int. Cl.
*H10F 77/12* (2025.01)
*H10F 19/80* (2025.01)
*H10K 30/40* (2023.01)

(52) U.S. Cl.
CPC ............. *H10F 77/12* (2025.01); *H10F 19/80* (2025.01); *H10K 30/40* (2023.02)

(58) Field of Classification Search
CPC .......... H10F 77/12; H10F 19/80; H10K 30/40
See application file for complete search history.

(56) References Cited

U.S. PATENT DOCUMENTS

| | | | |
|---|---|---|---|
| 2015/0303337 A1* | 10/2015 | Ishii | H10F 71/00 438/67 |
| 2017/0358398 A1* | 12/2017 | Beaumont | H10K 85/215 |
| 2019/0097144 A1* | 3/2019 | Huang | H10K 85/371 |
| 2022/0158105 A1* | 5/2022 | Hammond | H10K 39/10 |
| 2024/0234596 A1* | 7/2024 | Hem-Jensen | H10F 77/315 |
| 2025/0142980 A1* | 5/2025 | Barth | H10F 19/804 |

* cited by examiner

*Primary Examiner* — Jayne L Mershon
(74) *Attorney, Agent, or Firm* — Troutman Pepper Locke LLP; Tim Tingkang Xia, Esq.

(57) ABSTRACT

The perovskite solar cell includes in sequence: an upper encapsulation layer, an upper light-transmitting electrode layer, an upper carrier transport layer, a light-absorbing layer, a lower carrier transport layer, a lower light-transmitting electrode layer, a filling material layer, a encapsulation glue and a lower encapsulation layer. The surface of the filling material layer that is not in contact with the lower light-transmitting electrode layer is covered by the encapsulation glue. Alternatively, the filling material layer and the encapsulation glue are different layers. The ΔE difference (set by the International Commission on Illumination) between the color of the filling material layer and the material of the light-absorbing layer is less than 2, and the transmittance difference is less than 10%.

8 Claims, 3 Drawing Sheets

PEROVSKITE SOLAR CELL

CROSS-REFERENCE TO RELATED APPLICATIONS

This application claim priority to Taiwanese application Numbered 112144043, filed Nov. 15, 2023, which is herein incorporated by reference in its' integrity.

BACKGROUND OF THE INVENTION

Field of the Invention

The present disclosure relates to a solar cell, in particular to a perovskite solar cell.

Description of the Related Art

Conventional perovskite solar cells are usually n-i-p or p-i-n structures. For such structures, semiconductor layers of different properties are stacked in different sequences from the light incident surface to the backlight surface between the two electrodes. In general, n refers to an n-type semiconductor, the Fermi level (Ef) approaches to the conduction band, and the main carriers are electrons. Alternatively, p refers to a p-type semiconductor, the Fermi level approaches to the valence band, and the main carriers are holes. Furthermore, i refers to the intrinsic semiconductor, and the Fermi level approaches to the center of the energy system.

In the prior art, perovskite serving as the main material of intrinsic semiconductor will generate photogenerated current, i.e., an electron-hole pair, after absorbing photons. The n-type semiconductor conducts the generated electrons and blocks the holes, while the p-type semiconductor conducts the generated holes and blocks the electrons. Therefore, n-type semiconductor is called electron transport layer, and p-type semiconductor is called hole transport layer. In manufacturing process of large-area solar cells, large-area solar cells are cut into series-connected solar cell units so as to shorten the path of carriers to avoid recombination in material defects.

FIG. 1 is a cross-sectional view of a perovskite solar cell in the prior art. As shown in FIG. 1, the perovskite solar cell 100 is cut into solar cell units connected in series with each other. Adjacent solar cell units are cut into three sections along the cutting areas 104, 106 and 108. The cutting area 104 is cut for an inter-electrode short cut on the front side. The cutting area 106 is cut for series connection channels, and the series connection channels shown in the cutting area 106 will be filled with electrode materials so that adjacent units can be connected in series. The cutting area 108 is cut for an inter-electrode short cut on the rear side. As shown in FIG. 1, the perovskite solar cell 100 includes an encapsulation layer 110 on the front side, an encapsulation layer 112 on the rear side, an electrode 114 on the front side, an electrode 122 on the rear side, and a carrier transport layer 116, light-absorbing layer 118, carrier transport layer 120, external circuit 124 and external circuit 126. As shown in FIG. 1, the dotted line block 102 includes the cutting area 104, the cutting area 106 and the cutting area 108 that are the so-called cutting stripe.

As shown in FIG. 1, in the process of manufacturing a large-area solar cell, it is cut into small solar cell units connected in series to reduce the energy loss of carriers. Therefore, the cutting stripes (i.e., the dashed line block 102 in FIG. 1) between solar cell units show the color of the rear electrode material. If the electrode is a transparent electrode, the cutting stripes are transparent. Thus, the cutting stripes existing in large-area solar cells will damage the appearance of the building-material-integrated photovoltaic system.

Therefore, a perovskite solar cell capable of solving the aforementioned drawbacks is desirable.

SUMMARY OF THE INVENTION

Disclosed herein is an exemplary perovskite solar cell, including: a module, including: a first encapsulation layer; a first light-transmitting electrode layer disposed on an upper surface of the first encapsulation layer; a first carrier transport layer disposed on an upper surface of the first light-transmitting electrode layer; a light-absorbing layer disposed on an upper surface of the first carrier transport layer; a second carrier transport layer disposed on an upper surface of the light-absorbing layer; a second light-transmitting electrode layer disposed on an upper surface of the second carrier transport layer; and a filling material layer disposed on an upper surface of the second light-transmitting electrode layer or only on traces of the module; and an encapsulation glue used to adhere the inverted module to a second encapsulation layer, wherein the filling material layer and the encapsulation glue are different layers.

In another embodiment, the filling material layer is a filling pigment layer.

In another embodiment, the $\Delta E$ difference (set by the International Commission on Illumination) between colors of the filling pigment layer and the light-absorbing layer is less than 2, and a light transmittance difference is less than 10%.

In another embodiment, the first carrier transport layer is an electron transport layer, and the second carrier transport layer is a hole transport layer.

In another embodiment, the first carrier transport layer is a hole transport layer, and the second carrier transport layer is an electron transport layer.

In another embodiment, a thickness of the filling material layer ranges between 1 and 100 nm.

Disclosed herein is another exemplary perovskite solar cell, including: a module, including: a first encapsulation layer; a first light-transmitting electrode layer disposed on an upper surface of the first encapsulation layer; a first carrier transport layer disposed on an upper surface of the first light-transmitting electrode layer; a light-absorbing layer disposed on an upper surface of the first carrier transport layer; a second carrier transport layer disposed on an upper surface of the light-absorbing layer; a second light-transmitting electrode layer disposed on an upper surface of the second carrier transport layer; and a filling material layer disposed on an upper surface of the second light-transmitting electrode layer or only on traces of the module; and an encapsulation glue used to adhere the inverted module to a second encapsulation layer, wherein a surface of the filling material layer that is not in contact with the second light-transmitting electrode layer is covered by the encapsulation glue.

Disclosed herein is another exemplary perovskite solar cell, including: a module, including: a first encapsulation layer; a first light-transmitting electrode layer disposed on an upper surface of the first encapsulation layer; a first carrier transport layer disposed on an upper surface of the first light-transmitting electrode layer; a light-absorbing layer disposed on an upper surface of the first carrier transport layer; a second carrier transport layer disposed on an upper surface of the light-absorbing layer; a second light-transmitting electrode layer disposed on an upper surface of the second carrier transport layer; and a filling material layer disposed on an upper surface of the second light-transmitting electrode layer or only on traces of the module; and an encapsulation glue used to adhere the inverted module to a second encapsulation layer, wherein the filling material layer and the encapsulation glue are different layers; wherein ΔE difference (set by the International Commission on Illumination) between colors of the filling material layer and the light-absorbing layer is less than 2, and a transmittance difference is less than 10%; wherein a thickness of the filling material layer ranges between 1 and 100 nm Disclosed herein is another exemplary perovskite solar cell, including: a module, including: a first encapsulation layer; a first light-transmitting electrode layer disposed on an upper surface of the first encapsulation layer; a first carrier transport layer disposed on an upper surface of the first light-transmitting electrode layer; a light-absorbing layer disposed on an upper surface of the first carrier transport layer; a second carrier transport layer disposed on an upper surface of the light-absorbing layer; a second light-transmitting electrode layer disposed on an upper surface of the second carrier transport layer; and a filling material layer disposed on an upper surface of the second light-transmitting electrode layer or only on traces of the module; and an encapsulation glue used to adhere the inverted module to a second encapsulation layer, wherein a surface of the filling material layer that is not in contact with the second light-transmitting electrode layer is covered by the encapsulation glue; wherein ΔE difference (set by the International Commission on Illumination) between colors of the filling material layer and the light-absorbing layer is less than 2, and a transmittance difference is less than 10%; wherein a thickness of the filling material layer ranges between 1 and 100 nm.

Disclosed herein is another exemplary perovskite solar cell includes in sequence: an upper encapsulation layer, an upper light-transmitting electrode layer, an upper carrier transport layer, a light-absorbing layer, a lower carrier transport layer, a lower light-transmitting electrode layer, a filling material layer, a encapsulation glue and a lower encapsulation layer; wherein a surface of the filling material layer that is not in contact with the lower light-transmitting electrode layer is covered by the encapsulation glue, or the filling material layer and the encapsulation glue are different layers; wherein ΔE difference (set by the International Commission on Illumination) between colors of the filling material layer and the light-absorbing layer is less than 2, and the transmittance difference is less than 10%.

DESCRIPTION OF THE PREFERRED EMBODIMENTS

Figure 1:
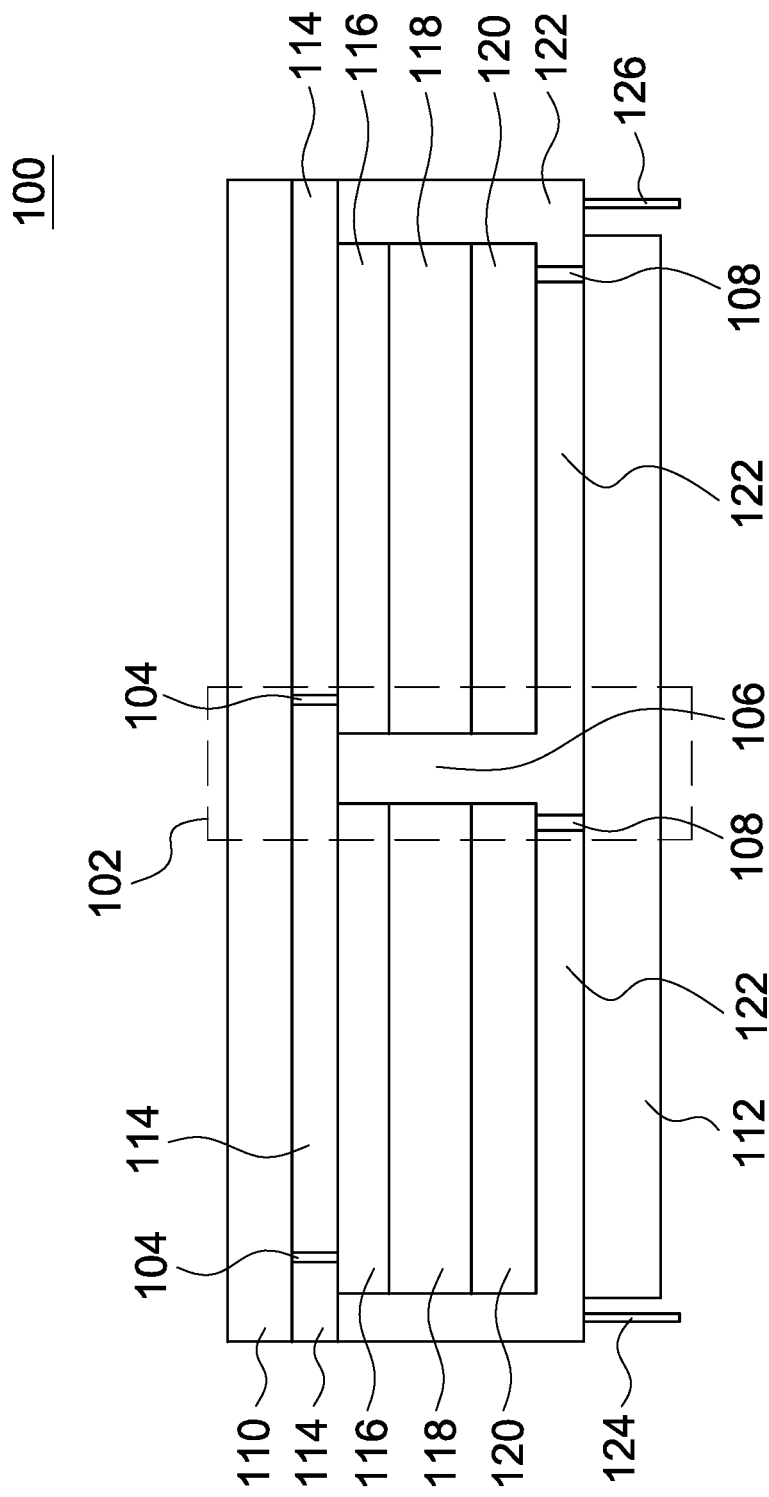
FIG. 1 is a cross-sectional view of a perovskite solar cell in the prior art.
Figure 2:
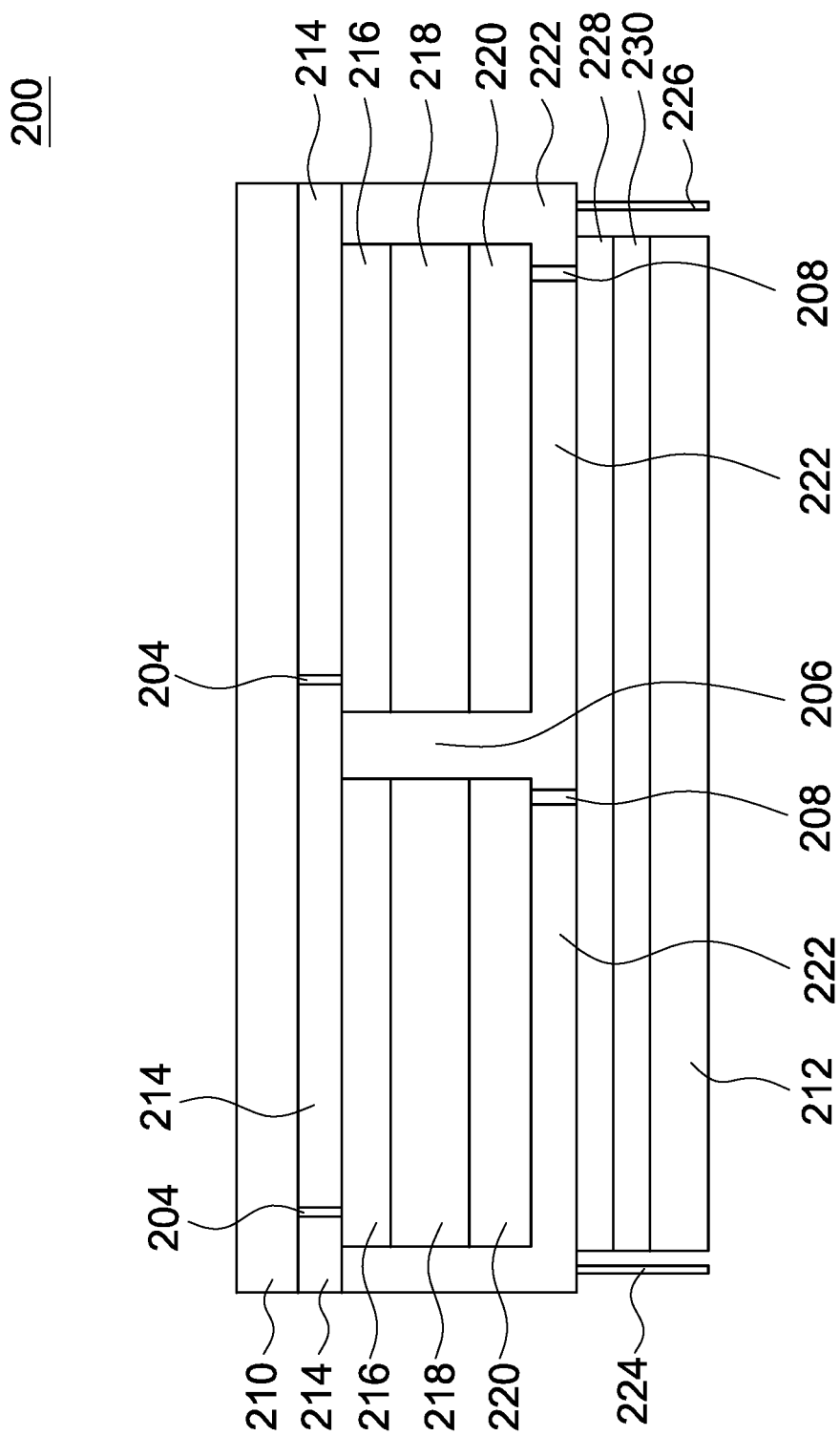
FIG. 2 is a cross-sectional view of a perovskite solar cell in accordance with an embodiment.
Figure 3:
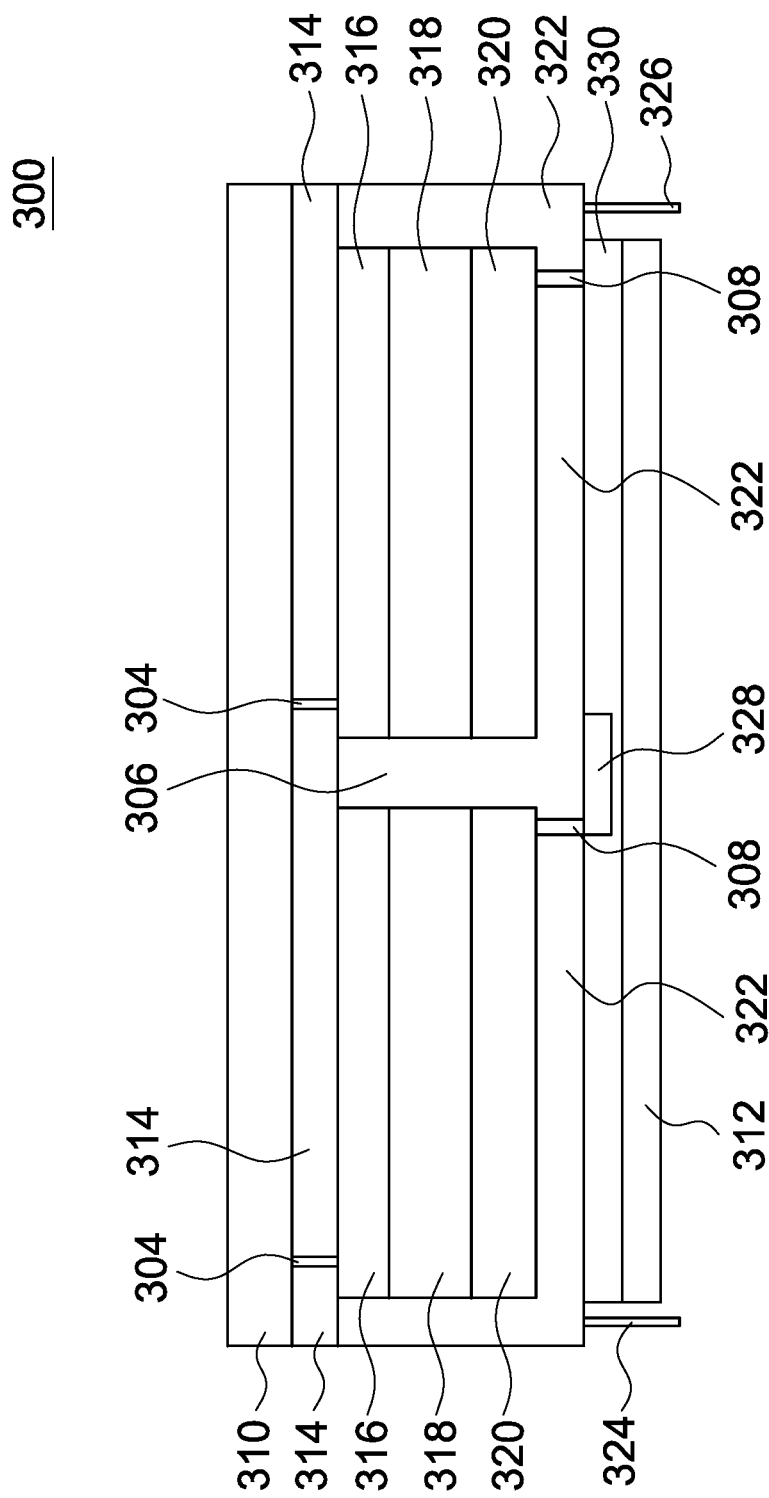
FIG. 3 is a cross-sectional view of a perovskite solar cell in accordance with an embodiment.

The present invention provides a light-penetrating perovskite solar cell structure to solve the shortcomings of the conventional perovskite solar cell structure. As shown in FIGS. 2 and 3, the light-penetrating perovskite solar cells of the present invention, from the display surface to the backlight surface, includes: packaging material adjacent to the display surface, electrodes adjacent to the display surface, carrier transport layer and light-absorbing layer in n-i-p or p-i-n structure, electrodes adjacent to the backlight surface, filling materials and packaging materials. In one embodiment of the present invention, the material of the light-absorbing layer contains a perovskite structure, and the filling material is a filling pigment. The filling pigment can be applied to the entire perovskite solar cell module shown in FIG. 2 and FIG. 3, or it can only block the laser stripes (i.e., where the filling material layer 328 is disposed) as shown in FIG. 3.

In one embodiment of the present invention, the packaging material adjacent to the backlight surface and the packaging material adjacent to the backlight surface are transparent glass. The transparent glass can be alkali-free glass, soda-lime glass or other glasses. Alternatively, the packaging material adjacent to the backlight surface and the packaging material adjacent to the backlight surface can also be made of transparent materials such as transparent plastic materials.

In an embodiment of the present invention, the materials of the electrode adjacent to the backlight surface and the electrode adjacent to the backlight surface include, but not limited to, fluorine-doped tin oxide (FTO), indium tin oxide (ITO), Indium Zinc Oxide (IZO), Al doped-ZnO (AZO), indium tungsten oxide (IWO), indium molybdenum oxide (IMO), zinc tin oxide (ZTO), indium titanium oxide (ITiO), indium oxide hydrate (IOH), antimony tin oxide (ATO) or a combination thereof.

In an embodiment of the present invention, the light-absorbing layer includes the perovskite material $ABX_3$. "A" includes one or more of the following monovalent cations: Formamidinium, methylammonium, cesium (Cs), rubidium (Rb). "B" includes one or more of the following divalent cations: lead (Pb), tin (Sn). "X" contains one or more of the following monovalent anions: chlorine (Cl), bromine (Br), iodine (I). The perovskite is not limited to a three-dimensional crystalline form. In other embodiments of the present invention, the perovskite can also be in a quasi-two-dimensional, two-dimensional, one-dimensional or quantum dot form.

In one embodiment of the present invention, the material of the electron transport layer is an n-type semiconductor, including, but not limited to, titanium dioxide ($TiO_2$), tin dioxide ($SnO_2$) and [6,6]-phenyl-C61-butyric acid methyl ester (PCBM), zinc oxide (ZnO), vanadium pentoxide ($V_2O_5$), zinc stannate ($Zn_2SnO_4$), fullerene C60, fullerene C70 or fullerene derivatives, etc.

In an embodiment of the present invention, the material of the hole transport layer is a p-type semiconductor material, including, but not limited to, nickel oxide (NiO), Molybdenum trioxide ($MoO_3$), cuprous oxide (Copper(I) oxide, $Cu_2O$), copper iodide (Copper(I) iodide, CuI), copper phthalocyanine (CuPc), copper (I) thiocyanate (CuSCN), redox graphene, poly[bis(4-phenyl)(2,4,6-trimethylphenyl)amine (PTAA), 2,2',7,7'-tetrakis[N,N-bis(4-methoxyphenyl)amino]-9,9'-spirobifluorene (Spiro-OMeTAD), poly(3,4-ethylenedioxythiophene) polystyrene sulfonate (PEDOT:PSS), poly[N,N'-bis(4-butylphenyl)-N,N'-bis(phenyl)-benzidine] (poly-TPD) or poly(N-vinylcarbazole) (PVK).

In one embodiment of the present invention, the filling material is an insulating material, e.g., a filling polymer or an inorganic compound, that matches the color of the perovskite layer, but is not limited thereto. In another embodiment of the present invention, any material of the light-absorbing layer with a color difference ΔE≤3 and a transmittance difference less than or equal to 10% can achieve the same effect of the entire solar module.

In an embodiment of the present invention, the encapsulating glue is an encapsulating material used to bond the entire module and the backlight surface. In other embodiments of the present invention, the encapsulant is an insulating material, including but not limited to thermoplastic polymer compounds, such as POE or UV curable glue.

In an embodiment of the present invention, the total power generation area of an exemplary structure is 64 square centimeters, and the exemplary structure is composed of 14 solar cell units that are connected in series. In one embodiment of the present invention, the packaging material adjacent to the display surface is soda-lime glass, the material of the electrode adjacent to the backlight surface is FTO, the carrier transport layer is an electron transport layer whose material is $TiO_2$, and the material of the light-absorbing layer is perovskite with a formula of $MAPbI_3$. In some embodiments regarding $ABX_3$, "A" is methylamine, "B" is Pb, and "X" is I. In some embodiments, the carrier transport layer is a hole transport layer whose material is Spiro-OMeTAD, the electrode adjacent to the backlight surface is IZO, the package glue is POE, and the packaging material adjacent to the backlight surface is soda-lime glass.

In an embodiment of the present invention, the filling pigment is a glass painted pigment with a color code of #4D0000, the ingredients thereof are acrylate copolymer, polyhydroxyethyl methacrylate (HEMA), etc., and the penetration thereof is 90%, so that the color of cutting lines in the solar cell material is similar to that of $MAPbI_3$.

Referring to FIG. 2, FIG. 2 is a cross-sectional view of a perovskite solar cell according to an embodiment of the present invention. As shown in FIG. 2, the perovskite solar cell 200, from the display surface to the backlight surface, includes: a cutting area 204, a cutting area 206, a cutting area 208, an encapsulation layer 210, an encapsulation layer 212, an electrode 214, a carrier transport layer 216, a light absorption layer 218, a carrier transport layer 220, an electrode 222, an external circuit 224, an external circuit 226, a filling material layer 228, an encapsulation glue 230. In one embodiment of the present invention, the electrode 214 is a first light-transmissive electrode layer that is disposed on an upper surface of the encapsulation layer 210 (e.g., the first encapsulation layer). The carrier transport layer 216 (e.g., the first carrier transport layer) is disposed on an upper surface of the electrode 214. The light-absorbing layer 218 is disposed on an upper surface of the carrier transport layer 216. The carrier transport layer 220 (e.g., the second carrier transport layer) is disposed on an upper surface of the light-absorbing layer 218. The electrode 222 is a second light-transmitting electrode layer that is disposed on an upper surface of the carrier transport layer 220. The filling material layer 212 is disposed on an upper surface of the electrode 222 or only on traces of the module. In some embodiments of the present application, the encapsulating glue 230 adheres the filling material layer 228 to the encapsulating layer 212 (e.g., the second encapsulating layer). The filling material layer 228 and the encapsulating glue 230 are different layers.

Referring to FIG. 3, FIG. 3 is a cross-sectional view of a perovskite solar cell according to an embodiment of the present invention. As shown in FIG. 3, the perovskite solar cell 300, from the display surface to the backlight surface, includes: a cutting area 304, a cutting area 306, a cutting area 308, an encapsulation layer 310, an encapsulation layer 312, an electrode 314, a carrier transport layer 316, a light absorption layer 318, a carrier transport layer 320, an electrode 322, an external circuit 324, an external circuit 326, a filling material layer 328, an encapsulation glue 330. In one embodiment of the present invention, the electrode 314 is a first light-transmissive electrode layer that is disposed on an upper surface of the encapsulation layer 310 (e.g., the first encapsulation layer). The carrier transport layer 316 (e.g., the first carrier transport layer) is disposed on an upper surface of the electrode 314. The light-absorbing layer 318 is disposed on an upper surface of the carrier transport layer 316. The carrier transport layer 320 (e.g., the second carrier transport layer) is disposed on an upper surface of the light-absorbing layer 318. The electrode 322 is a second light-transmitting electrode layer that is disposed on an upper surface of the carrier transport layer 320. The filling material layer 312 is disposed on an upper surface of the electrode 322 or only on traces of the module. In some embodiments of the present application, an encapsulation glue 330 is used to adhere the filling material layer 328 to the encapsulation layer 312 (e.g., the second encapsulation layer). Specifically, a surface of the filling material layer 328 that is not in contact with the electrode 322 is covered by the encapsulation glue 330.

In one embodiment, the filling material layer is a filling pigment layer.

In one embodiment, the $\Delta E$ difference (set by the International Commission on Illumination) between colors of the filling pigment layer and the light-absorbing layer is less than 2, and a light transmittance difference is less than 10%.

In one embodiment, the first carrier transport layer is an electron transport layer, and the second carrier transport layer is a hole transport layer.

In another embodiment, the first carrier transport layer is a hole transport layer, and the second carrier transport layer is an electron transport layer.

In one embodiment, a thickness of the filling material layer ranges between 1 and 100 nm.

In an embodiment of the present invention, the preparation sequence of the integrated solar cell element is from the display surface (front side) to the backlight surface (i.e., rear side). An exemplary preparation method is described as follows. FTO glass is selected as the substrate, and then $TiO_2$ is vacuum sputtered on the FTO glass, and then a precursor liquid containing nano-$TiO_2$ is coated, and then annealed to 550° C. so that an electron transport layer is obtained. Next, a coating process is performed to form a light-absorbing layer on an upper surface of $TiO_2$. In details, a precursor solution containing methylammonium iodide, lead iodide ($PbI_2$) and methylammonium chloride is coated on the upper surface of $TiO_2$. Subsequently, an annealing process is performed at 120° C., and then a precursor containing Spiro-OMeTAD is coated on the upper surface of the light-absorbing layer to form a carrier transport layer as the hole transport layer. Next, IZO is vacuum sputtered on the carrier transport layer as an electrode adjacent to the backlight surface. Next, the filling pigment is sprayed on the electrode adjacent to the backlight surface. Subsequently, soda-lime glass is disposed on the upper surface of the overall component as an encapsulation layer adjacent to the backlight surface. Finally, polyolefin elastomers (POE) glue is used as the encapsulating film, and is vacuum laminated at 120° C. to complete the encapsulation. Such integrated solar cell element is basically as described above, only the filling material is applied on the so-called P2 line (ie, laser stripe) by inkjet printing.

In an embodiment of the present invention, the manufacturing methods of the light-transmitting perovskite solar cell of the present invention further include an etching step and a filling step. In order to shorten the path of carriers in solar cells and avoid carrier recombination due to material defects, large-area solar cells are etched into series-connected solar cells during the manufacturing process. In one embodiment of the present invention, the electrode layer and the series connection channel are etched respectively, and the electrodes are filled in the series connection channel to form a series connection solar cell unit. Referring to FIG. 2 that is a schematic diagram of two solar cell units connected in series. As shown in FIG. 2, in an embodiment of the present invention, etching step is performed on the first light-transmitting electrode layer, the series connection channel and the second light-transmitting electrode layer. The series connection channel is a structure formed by stacking a first carrier transport layer, a light absorbing layer and a second carrier transport layer. In an embodiment of the present invention, the first light-transmitting electrode layer is etched to form a first etching line E1, and the second light-transmitting electrode layer is etched to form a second etching line E2. In one embodiment of the present invention, alternative etching steps are performed respectively after the first light-transmitting electrode layer, the series connection channel and the second light-transmitting electrode layer are completed. It should be noted in particular that after etching the series connection channels, electrodes will be filled in the etched lines first to form series connection electrodes. Then, the second light-transmitting electrode layer is prepared and etched, and the two ends of the series electrode are electrically connected to the first light-transmitting electrode layer and the second light-transmitting electrode layer respectively, thereby forming a path to allow current to flow. Therefore, the first light-transmitting electrode layer and the second light-transmitting electrode layer are disconnected respectively through the first etching line E1 and the second etching line E2, and the adjacent solar cell units are connected in series with the series electrodes to form each of the aforementioned solar cell units.

In one embodiment of the present invention, as shown in FIG. 2, the edges of the two solar cell units are cut, so there is some residual structure. For example, a residual series connection electrode after cutting is connected to the right side of the series connection channel of the right solar cell unit, and a residual second light-transmitting electrode layer is connected below the remaining series connection electrode. Furthermore, as shown in FIG. 2, the lower surface of the second light-transmitting electrode layer of the left solar cell unit is electrically connected to the first external circuit. The lower surface of the residual second light-transmitting electrode layer connected to the right side of the series connection channel of the right solar cell unit is electrically connected to a second external circuit, and the current flows from the first external circuit to the second external circuit path. If the current passes through the first external circuit, the current first flows into the second light-transmitting electrode layer of the left solar cell unit, and then flows through the series connection channel of the left solar cell unit. Subsequently, the current flows through the first light-transmitting electrode layer of the left solar cell unit, and then the current flows into the second light-transmissive electrode layer of the right solar cell unit through the series electrode between the left solar cell unit and the right solar cell unit. Then, the current flows through the series connection channel of the right solar cell unit and the first light-transmitting electrode layer in sequence, and finally the current flows to the second external lines through the remaining series connection channel and the remaining second light-transmitting electrode that are both connected on the right. In one embodiment of the present invention, IZO is filled as a series electrode by sputtering. Alternatively, in other embodiments of the present invention, one or more transparent electrode material such as FTO, ITO, AZO, IWO, IMO, ZTO, ITIO, IOH or ATO can also be filled as a series electrode.

While this invention has been described with respect to at least one embodiment, the invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A perovskite solar cell, including:
   a module, including:
      a first encapsulation layer;
      a first light-transmitting electrode layer disposed on a rear facing surface of the first encapsulation layer;
      a first carrier transport layer disposed on a rear facing surface of the first light-transmitting electrode layer;
      a light-absorbing layer disposed on a rear facing surface of the first carrier transport layer;
      a second carrier transport layer disposed on a rear facing surface of the light-absorbing layer;
      a second light-transmitting electrode layer disposed on a rear facing surface of the second carrier transport layer; and
      a filling material layer disposed on a rear facing surface of the second light-transmitting electrode layer or only on traces of the module; and
   an encapsulation glue used to adhere the module to a second encapsulation layer, wherein the filling material layer and the encapsulation glue are different layers,
   wherein the filling material layer is a filling pigment layer, and wherein the ΔE difference set by the International Commission on Illumination between a color of the filling pigment layer and a color of the light-absorbing layer is less than 2, and a light transmittance difference is less than 10%.

2. The perovskite solar cell of claim 1, wherein the first carrier transport layer is an electron transport layer, and the second carrier transport layer is a hole transport layer.

3. The perovskite solar cell of claim 1, wherein the first carrier transport layer is a hole transport layer, and the second carrier transport layer is an electron transport layer.

4. The perovskite solar cell of claim 1, wherein a thickness of the filling material layer ranges between 1 and 100 nm.

5. A perovskite solar cell, including:
   a module, including:
      a first encapsulation layer;
      a first light-transmitting electrode layer disposed on a rear facing surface of the first encapsulation layer;
      a first carrier transport layer disposed on a rear facing surface of the first light-transmitting electrode layer;
      a light-absorbing layer disposed on a rear facing surface of the first carrier transport layer;
      a second carrier transport layer disposed on a rear facing surface of the light-absorbing layer;
      a second light-transmitting electrode layer disposed on a rear facing surface of the second carrier transport layer; and a filling material layer disposed on a rear facing surface of the second light-transmitting electrode layer or only on traces of the module; and an encapsulation glue used to adhere module to a second encapsulation layer, wherein a surface of the filling material layer that is not in contact with the second light-transmitting electrode layer is covered by the encapsulation glue, wherein the filling material layer is a filling pigment layer, and wherein the ΔE difference set by the International Commission on Illumination between a color of the filling pigment layer and a color of the light-absorbing layer is less than 2, and a light transmittance difference is less than 10%.

6. A perovskite solar cell, including:
a module, including:
   a first encapsulation layer;
   a first light-transmitting electrode layer disposed on a rear facing surface of the first encapsulation layer;
   a first carrier transport layer disposed on a rear facing surface of the first light-transmitting electrode layer;
   a light-absorbing layer disposed on a rear facing surface of the first carrier transport layer;
   a second carrier transport layer disposed on a rear facing surface of the light-absorbing layer;
   a second light-transmitting electrode layer disposed on a rear facing surface of the second carrier transport layer; and
   a filling material layer disposed on a rear facing surface of the second light-transmitting electrode layer or only on traces of the module; and
an encapsulation glue used to adhere the module to a second encapsulation layer, wherein the filling material layer and the encapsulation glue are different layers;
wherein ΔE difference set by the International Commission on Illumination between a color of the filling material layer and a color of the light-absorbing layer is less than 2, and a transmittance difference is less than 10%;
wherein a thickness of the filling material layer ranges between 1 and 100 nm.

7. A perovskite solar cell, including:
a module, including:
   a first encapsulation layer;
   a first light-transmitting electrode layer disposed on a rear facing surface of the first encapsulation layer;
   a first carrier transport layer disposed on a rear facing surface of the first light-transmitting electrode layer;
   a light-absorbing layer disposed on a rear facing surface of the first carrier transport layer;
   a second carrier transport layer disposed on a rear facing surface of the light-absorbing layer;
   a second light-transmitting electrode layer disposed on a rear facing surface of the second carrier transport layer; and
   a filling material layer disposed on a rear facing surface of the second light-transmitting electrode layer or only on traces of the module; and
an encapsulation glue used to adhere the module to a second encapsulation layer, wherein a surface of the filling material layer that is not in contact with the second light-transmitting electrode layer is covered by the encapsulation glue;
wherein ΔE difference set by the International Commission on Illumination between a color of the filling material layer and a color of the light-absorbing layer is less than 2, and a transmittance difference is less than 10%;
wherein a thickness of the filling material layer ranges between 1 and 100 nm.

8. A perovskite solar cell includes in sequence: a first encapsulation layer, a first light-transmitting electrode layer, a first carrier transport layer, a light-absorbing layer, a second carrier transport layer, a second light-transmitting electrode layer, a filling material layer, a encapsulation glue and a second encapsulation layer;
   wherein a surface of the filling material layer that is not in contact with the second light-transmitting electrode layer is covered by the encapsulation glue, or the filling material layer and the encapsulation glue are different layers; and wherein ΔE difference set by the International Commission on Illumination between a color of the filling material layer and a color of the light-absorbing layer is less than 2, and the transmittance difference is less than 10%.

* * * * *